United States Patent [19]

Kabelac et al.

[11] Patent Number: 4,458,335
[45] Date of Patent: Jul. 3, 1984

[54] DETECTOR STRUCTURE FOR ION-IMPLANTED CONTIGUOUS-DISK BUBBLE DEVICES

[75] Inventors: William J. Kabelac, Morgan Hill; Ian L. Sanders, Sunnyvale, both of Calif.

[73] Assignee: International Business Machines Corporation, Armonk, N.Y.

[21] Appl. No.: 481,114

[22] Filed: Apr. 1, 1983

[51] Int. Cl.³ .............................................. G11C 19/08
[52] U.S. Cl. .......................................... 365/8; 365/36
[58] Field of Search .............................. 365/8, 36, 41

[56] References Cited

PUBLICATIONS

IEEE Transactions on Magnetics–vol. MAG–15, No. 6, Nov. 1979; pp. 1642–1647.
IBM Technical Disclosure Bulletin, vol. 24, No. 5, p. 2398, Oct. 1981; "A Center Fed Ion–Implanted Channel High Speed Bubble Detector for CD Devices".
IBM TDB vol. 22, No. 4, p. 1704, Sep. 1979, "A Two-Way Stretcher for Contiguous–Disk Sensors".
Bell System Technical Journal, vol. 59, No. 2, p. 229, Feb. 1980.
Journal of Applied Physics, vol. 53, No. 3, p. 2525, Mar. 1982.

*Primary Examiner*—James W. Moffitt
*Attorney, Agent, or Firm*—Joseph E. Kieninger

[57] ABSTRACT

A detector structure for contiguous-disk bubble devices has a non-ionimplanted elongated bar, a hairpin conductor and a thin-film magneto-resistive element. The elongated bar is positioned in spaced relation to a large period element at the end of a propagation loop. The elongated bar extends both above and below the large period element and prevents the bubble from passing around the element. The hairpin conductor is positioned over the edge of the bar that faces the end period element. The magneto-resistive element is positioned parallel to and at the center of the hairpin conductor.

7 Claims, 2 Drawing Figures

DETECTOR STRUCTURE FOR ION-IMPLANTED CONTIGUOUS-DISK BUBBLE DEVICES

TECHNICAL FIELD

This invention relates to ion-implanted contiguous-disk bubble devices and more particularly to a detector for ion-implanted contiguous disk bubble devices.

BACKGROUND ART

A number of detector structures are available for use in ion-implanted contiguous-disk bubble devices. In IBM Technical Disclosure Bulletin, Vol. 22, No. 4, page 1704 September 1979, A Two-way Stretcher for Contiguous-Disk Sensors is described. This detection system however, uses the self-aligned approach, that is, it uses the control conductor as an implantation mask and requires high current applitudes for bubble expansion of the order of 200 mA or more. This causes large power dissipation which limits the usefulness of the device, particularly at high frequency of operations, say 200 kHz or greater. In IBM Technical Disclosure Bulletin Vol. 24 No. 5, page 2398, October 1981, A Center Fed Ion-Implanted Channel High Speed Bubble Detector for Contiguous-Disk Devices is described. This detector consists of a hairpin conductor positioned on a narrow ion-implanted channel. The detector, however, suffers from erratic nucleation of bubble domains in the ion-implanted channel.

Bubble detectors for ion-implanted devices are also described in the Bell System Technical Journal, Vol. 59 No. 2, page 229 February 1980. These detectors expand bubbles in one direction only and employ either a hairpin conductor positioned over an ion-implanted channel or a hairpin conductor positioned over a totally implanted or a totally non-implanted region. These detectors exhibit relatively poor operating margins and cannot be used at high operating frequencies because of the time limitation imposed by unidirectional expansion. In general they are suitable for frequencies of no more than 50 kHz.

Another bubble detector is described in Journal of Applied Physics, Vol. 53 No. 3, page 2525, March 1982. This is a non-destructive detector, that is, one in which the bubble domain is preserved after detection. It provides unidirectional bubble expansion using two sets of control conductors positioned over a totally non-implanted area. The frequency of operation is 50 kHz.

SUMMARY OF THE INVENTION

It is the objective of this invention to provide a bubble detector for ion-implanted devices that can be operated over a wide range of frequencies with moderate power dissipation and allow for maximum flexibility in device operating conditions.

A detector structure for contiguous-disk bubble devices has a non-ionimplanted elongated bar, a hairpin conductor and a thin film magneto-resistive element. The elongated bar is positioned in spaced relation to a large period element at the end of a propagation loop. The elongated bar extends both above and below the large period element. The orientation of the structure with respect to the crystallographic axes of the bubble-supporting garnet layer is such that the gap between the end propagation element and the edge of the bar prevents the bubble from propagating around the end element. However, the gap allows unimpeded bi-directional domain expansion along the edge of the bar that faces the end propagation element. The hairpin conductor is positioned over the edge of the non-ionimplanted bar that faces the end propagation element. The outside edge of the hairpin conductor farthest from the end propagation element is substantially coincident with the edge of the non-ionimplanted bar farthest from the end propagation element. In a preferred embodiment, the width of the conductor portion of the hairpin farthest from the end element is greater than the width of the conductor portion closest to the end element. The magneto-resistive element is positioned parallel to and substantially at the center of the hairpin conductor.

BRIEF DESCRIPTION OF THE DRAWINGS

The invention will now be described by way of example and reference to the accompanying drawings in which.

DESCRIPTION OF THE PREFERRED EMBODIMENT

Figure 1:
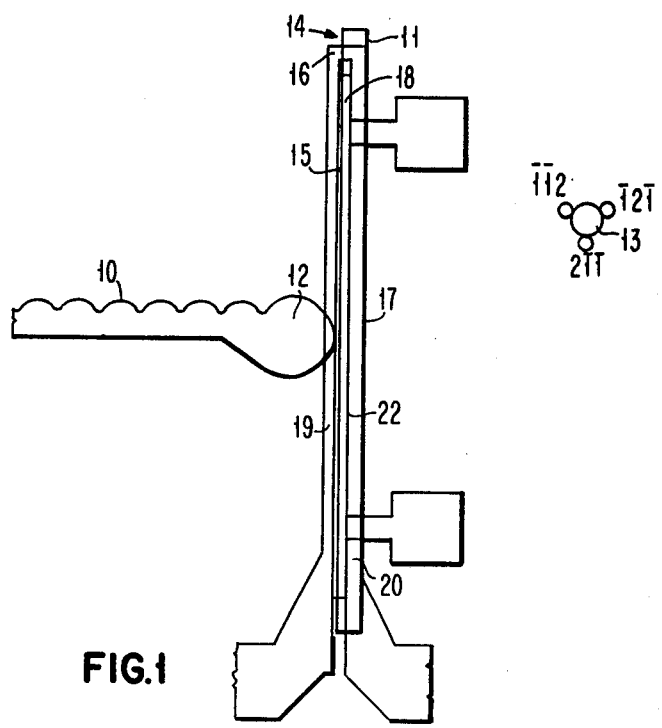
FIG. 1 is a top view of a preferred embodiment in accordance with this invention.

As shown in FIG. 1, a bubble propagating from left to right on the major loop propagation channel 10 passes to the end period element 12. Positioned in spaced relation to the tip portion of the end period element 12 is a non-implanted elongated bar 14 forming a narrow gap therebetween. The bar 14 extends both above and below the end period element 12. The gap between the tip portion of the end period element 12 and the edge of the bar 14 is of the same order as the bubble being propagated. For example, in a one micron diameter bubble device, the gap is approximately one micron. The end period element 12 and the elongated bar 14 are oriented such that the length of the bar is along one of the primary crystaline axes 13 of the bubble supporting garnet. The hairpin conductor 16 is positioned about the non-implanted bar 14 so that the bar edge 15 is positioned within the hairpin conductor. The edge 17 of the hairpin conductor 16 is positioned so that it is substantially coincident with the edge 11 of non-implanted bar 14. In a preferred embodiment the width of portion 19 of the hairpin conductor is narrower than portion 20 of the hairpin conductor. For example, in a one micron diameter bubble device, the width of portion 19 is approximately two microns and the width of portion 20 is approximately three to four microns. The width of the non-implanted bar 14 is determined by the width of the hairpin conductor 16, so that edge 11 is substantially coincident with edge 17 of the hairpin conductor. For example, in the one micron diameter bubble device the width of the non-implanted bar is approximately five microns. A magneto-resistive sensor element 18 is positioned parallel to the hairpin conductor. The magneto-resistive sensor is positioned substantially at the center of the hairpin conductor 16.

Figure 2:
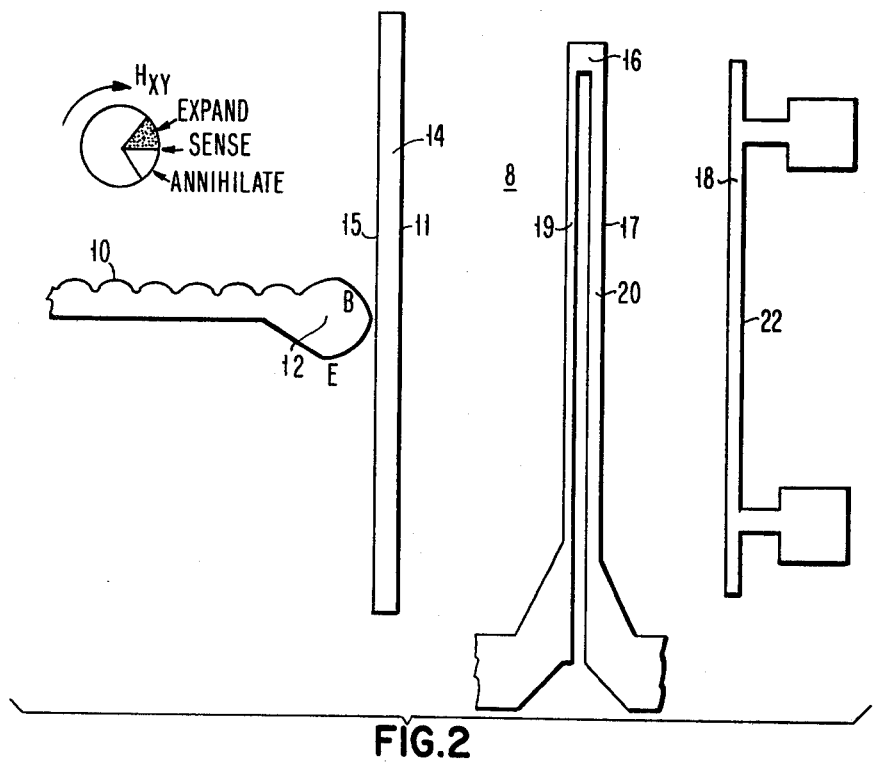
FIG. 2 is a exploded top view of the structure shown in FIG. 1.

The operation of the detector 8 will be described by reference to FIG. 2 in which the individual components of the structure are shown separately. Bubbles that are to be sensed propagate along the major loop 10. When a bubble reaches point B of the large period end element 12, the hairpin conductor 16 is activated by a current pulse of the appropriate polarity causing the bubble domain to elongate along the edge 15 of the non-implanted bar 14. The inherent affinity of the bubble domain for the ion-implanted/non-implanted boundary ensures that the bubble expands along the edge of the bar 14. A small gap between the large period end element 12 and the bar 14 acts as a bubble propagation inhibitor and prevents the bubble from passing around the element 12 to point E. The gap, however, permits the bubble to be expanded bidirectionally along edge 15 of the non-implanted bar 14. The amplitude of the stretching pulse is typically 90–130 mA. The duration of the stretching current pulse at 200 kHz rotating field grequency is approximately 0.6 to 0.8 micro-seconds which is equivalent to a phase angle of roughly fifty degrees. The elongated bubble domain is detected at the termination of the stretching pulse by the thin film magneto-resistive sensor 18 which is located substantially at the center of the hairpin conductor 16. At this time the orientation of the rotating magnetic drive field is approximately perpendicular to the long axis of the sensor element 18. It is desirable to detect the elongated bubble at this orientation of the rotating drive field since the sensitivity of the magneto-resistive sensor element is maximized by the biasing effect of the drive field. The duration of the stretching pulse should therefore be adjusted to the particular rotating field frequency used. For example, at 400 kHz the optimum stretching pulse duration would be 0.3 to 0.4 micro seconds. After magneto-resistive detection, the current polarity through the hairpin conductor is immediately reversed to effect the annihilation of the elongated bubble domain. The amplitude and duration of the annihilation pulse is approximately the same as the amplitude and duration of the stretching pulse.

During the period the annihilation pulse is applied, the expanded bubble domain is translated towards the edge 11 of the nonimplanted bar 14. The translation of the domain is a result of the combined effect of the magnetic field gradient produced by the current pulse in the hairpin conductor and the attractive magnetic pole distribution at the edge 22 of the magneto-resistive element 18. In the preferred embodiment the portion 20 of the hairpin conductor is wider than portion 19 of the hairpin conductor. This asymmetry enhances the field gradient and results in more reliable translation of the elongated bubble domain. The magnetic charge along the edge 11 of the nonimplanted bar 14 is negative with respect to the bubble polarity due to the implanted/nonimplanted transition in the garnet layer. The charge at the transition therefore causes the elongated bubble domain to collapse. If the non-implanted bar is omitted, then the operation of the detector is considerably degraded. In particular, bubble domain annihilation after detection is very unreliable.

This type of detector has been shown to operate reliably in a one micron diameter bubble device, that is, at error rates better than $10^{-8}$, over wide operating margins, that is, bias field ranges of 12% and drive field ranges of ±10 oe, and over wide temperature extremes, that is, 20° C. to 90° C.

The detector has been operated over a frequency range of 100 kHz to 400 kHz with minimal variation in operating characteristics.

Although a preferred embodiment of this invention has been described, it is understood that numerous variations may be made in accordance with the principle of this invention.

What is claimed is:

1. A detector capable of two-way bubble expansion for use in ion-implanted contiguous-disk bubble devices having a nonimplanted end element, said detector comprising:
   a nonimplanted bar having a first edge in spaced relation with said non-implanted end element to inhibit bubbles from passing around said end element, said bar having a second edge;
   a hairpin conductor positioned over said first edge, said conductor having an outer edge aligned with said second edge; and
   a thin-film magneto-resistive element associated with said conductor.

2. A detector as described in claim 1 having a bar portion extending above said nonimplanted region.

3. A detector as described in claim 1 having a bar portion extending below said end element.

4. A detector as described in claim 1 wherein the spacing between the bar and the end element is about the size of the bubble being propagated.

5. A detector as described in claim 1 wherein the spacing between the bar and the end element is about one micron.

6. A detector as described in claim 1 wherein said magneto-resistive element is parallel to said hairpin conductor.

7. A detector as described in claim 1 wherein said magneto-resistive element is positioned substantially at the center of the hairpin conductor.

* * * * *